(12) United States Patent
Muramatsu (10) Patent No.: US 6,854,047 B2
(45) Date of Patent: Feb. 8, 2005

(54) DATA STORAGE DEVICE AND DATA TRANSMISSION SYSTEM USING THE SAME

(75) Inventor: Hirofumi Muramatsu, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 167 days.

(21) Appl. No.: 10/079,507

(22) Filed: Feb. 22, 2002

(65) Prior Publication Data

US 2003/0056077 A1 Mar. 20, 2003

(30) Foreign Application Priority Data

Sep. 20, 2001 (JP) ........................................ 2001-286902

(51) Int. Cl.⁷ .............................................. G06F 12/00
(52) U.S. Cl. ........................................ 711/211; 703/25
(58) Field of Search .......................... 703/24, 25, 27; 711/211

(56) References Cited

U.S. PATENT DOCUMENTS 5,276,812 A * 1/1994 Yamada et al. ............. 711/105
5,768,563 A * 6/1998 Porter et al. ................ 703/27
6,240,377 B1 * 5/2001 Kai et al. .................... 703/24
6,263,305 B1 * 7/2001 Yamaga ...................... 703/25

* cited by examiner

*Primary Examiner*—Mano Padmanabhan
*Assistant Examiner*—Thang Ho
(74) *Attorney, Agent, or Firm*—Rabin & Berdo, P.C.

(57) ABSTRACT

A micro-controller is connected to an external circuit via an address bus and a read control signal line. The external circuit includes an enable circuit, a decoder and a register group. The enable circuit produces an enable signal from the sixteenth bit of 16-bit information on the address bus and a control signal on the read control signal line. The decoder creates an address from the ninth to fifteenth bits of the 16-bit information. When the enable signal is valid, the register group writes a signal value of the first to eighth bits of the 16-bit information into a register specified by the address. Accordingly, the micro-controller can send the read control signal, the register address and the register data to the external circuit via the address bus. It is therefore possible to write data into the external circuit without using a write control signal line.

14 Claims, 5 Drawing Sheets

DATA STORAGE DEVICE AND DATA TRANSMISSION SYSTEM USING THE SAME

BACKGROUND OF THE INVENTION

1. Field of the Invention

The present invention relates to a data storage device used for data transmission through a bus, and also relates to a data transmission system that operates with such a data storage device.

2. Description of the Related Art

Data transmission through one or more buses on a single circuit board or in a single system is known in the art.

In order to transmit data between a processing circuit (e.g., micro-controller) and an external memory (e.g., random access memory), the processing circuit and external memory are connected to each other by data and address buses. The processing circuit and external memory are also connected to each other by read and write control signal lines.

The processing circuit outputs a read address on the address bus to read data from the external memory. Upon receiving the read address via the address bus, the external memory locates data in its storage on the basis of the read address and outputs the data on the data bus. The processing circuit then makes the read control signal active, and takes the data from the data bus. The read control signal informs the external memory of a fact that the data has been read.

When the processing circuit writes data into the external memory, on the other hand, the processing circuit outputs a write address on the address bus and a write data on the data bus, and turns the write control signal to an active state. Upon detecting the active write control signal, the external memory receives the address from the address bus and the data from the data bus, and writes the data into a storage area specified by the address.

Other types of processing circuits are also known in the art. For example, a certain type of processing circuit does not write data into an external memory. In other words, the processing circuit is designed to only read data from the external memory. This is because data writing is not performed when the external memory is a ROM (Read Only Memory) or the like.

If the processing circuit does not write data into an external circuit (or memory), the processing circuit naturally does not have a function of generating and outputting a write control signal. An interface for this type of processing circuit can be coupled to the address bus, data bus and read control signal line, but cannot be coupled to the write control signal line.

A system equipped with a processing circuit such as a micro-controller often increases functions by replacing an external circuit or attaching an additional external circuit. Such function expansion sometimes entails modification of the system; if the processing circuit is originally designed not to write data into the external memory, a user of the modified system may want the processing circuit to be able to perform the data writing.

Since the processing circuit designed to perform no data writing to an external circuit (memory) does not have a function of producing and outputting a write control signal, such processing circuit is no use in the system in terms of data writing from the processing circuit into an external memory. In order for the system to be able to write data into the external memory, therefore, the processing circuit should be replaced with another processing circuit. The processing circuit is, however, very expensive.

There is a demand for a technique that operates or controls a processing circuit, which is designed not to write data into an external circuit, to be able to write data into an external memory or the like.

SUMMARY OF THE INVENTION

According to one aspect of the present invention, there is provided a data storage device comprising: an interface for accepting n-bit information from an address bus and a read control signal from a control signal line, the n-bit information including an operation mode bit, an address bit and a data bit; an enable circuit for creating an enable signal from the operation mode bit and read control signal; a decoder for creating an address from the address bit; and a register for storing the data bit in accordance with the address when the enable signal is valid. The data storage device can receive from the address bus the read control signal, address and data to be written into the data storage device. It is therefore possible to write data into the data storage device without using a write control signal line.

According to another aspect of the present invention, there is provided a data transmission system comprising: a micro-controller for outputting n-bit information on an address bus and a read control signal on a control signal line, the n-bit information including an operation mode bit, an address bit and a data bit; and a data storage unit including, wherein the data storage device includes an interface for accepting the n-bit information from the address bus and the read control signal from the control signal line, an enable circuit for creating an enable signal from the operation mode bit and read control signal, a decoder for creating an address from the address bit, and a register for storing the data bit in accordance with the address when the enable signal is valid. The data transmission system can send the read control signal, the writing address in the data storage device and the data to be written into the data storage device, from the micro-controller to the data storage device through the address bus. It is therefore possible to write data into the data storage device without using a write control signal line.

DETAILED DESCRIPTION OF THE INVENTION

Embodiments of the present invention will be described in reference to the accompanying drawings. It should be noted that particular number, size, shape and positional relationship between parts and elements are mentioned in the following description and illustrated in the drawings to facilitate understanding of the embodiments, but they are for merely descriptive purposes and are not intended to limit the present invention in any aspects.

First Embodiment:

A data storage device and a data transmission system according to a first embodiment of the present invention will be described.

Figure 1:
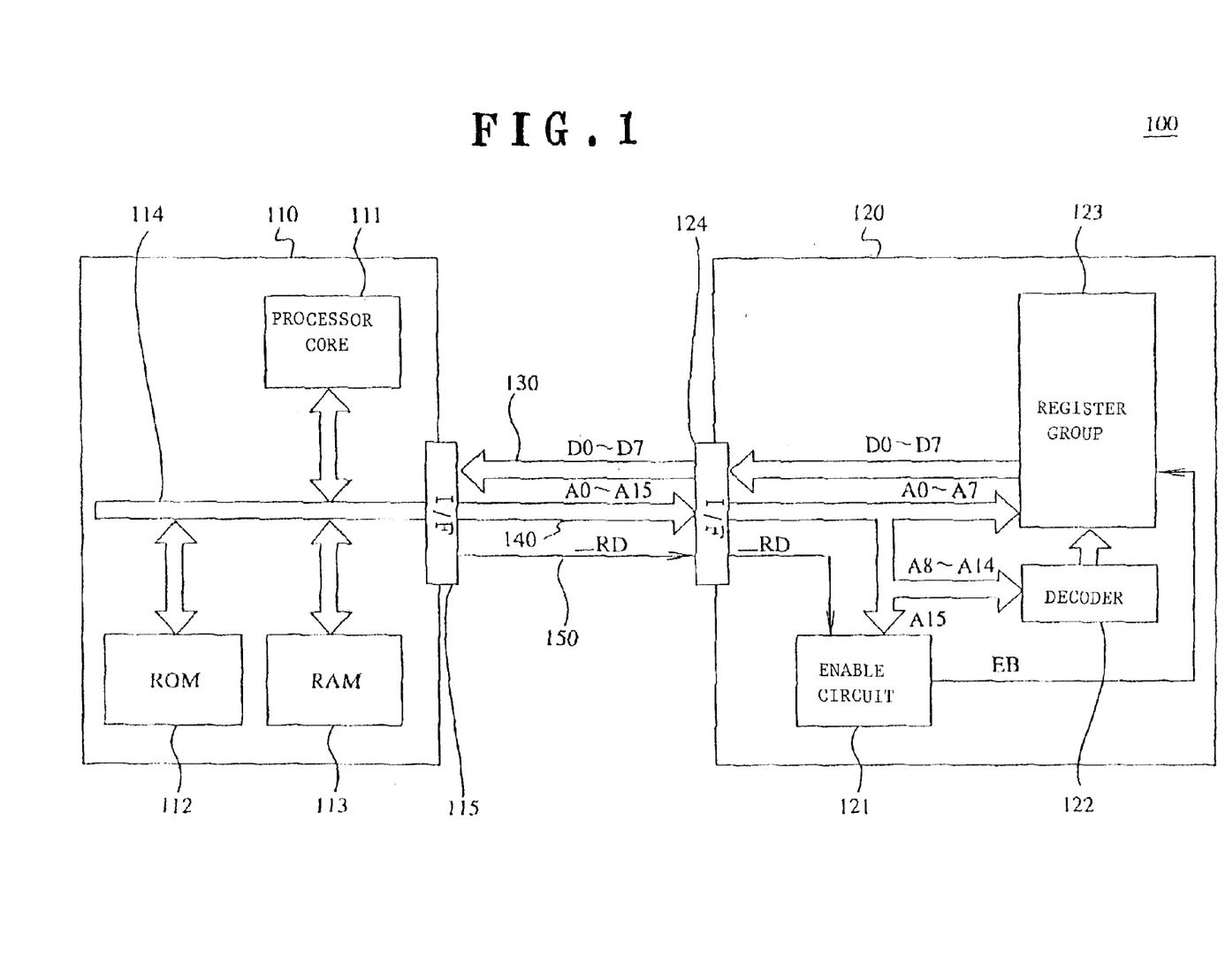
FIG. 1 is a block diagram showing a structure of a data transmission system according to a first embodiment of the present invention.

Referring to FIG. 1, illustrated is a block diagram showing a schematic structure of a data transmission system 100. The system 100 includes a micro-controller 110, an external circuit 120, a data bus 130, an address bus 140 and a read control signal line 150. The micro-controller 110 is an example of a processing circuit, and the external circuit 120 is an example of a data storage device. The external circuit 120 is, for example, an external memory.

The micro-controller 110 has a processor core 111, a ROM 112, a RAM (Random Access Memory) 113, an internal bus 114 and an external memory interface 115. The processor core 111 does not write data into the external circuit 120 but reads data from the external circuit 120. ROM 112 stores programs for the processor core 111 to execute data processing operations. RAM 113 temporarily stores data, is processed by the processor core 111. The programs and data are transmitted among the processor core 111, ROM 112, RAM 113 and external memory interface 115 through the internal bus 114. The external memory interface 115 is an interface that couples the internal bus 114 with the data bus 130, address bus 140 and read control signal line 150. In this embodiment, the data bus 130 has eight bits, and signals of the respective bits are represented by D0 to D7. The address bus 140 has sixteen bits, and signals of the respective bits are represented by A0 to A15.

The external circuit 120 includes an enable circuit 121, a decoder 122, a register group 123 and an interface 124. The enable circuit 121 accepts the most significant bit (i.e., operation mode bit) A15 of the 16-bit information from the address bus 140 and a read control signal _RD from the read control signal line 150 via the interface 124. When the read control signal _RD is "0" and the address signal A15 is "1", the enable circuit 121 determines that the current mode is a write mode, and makes an enable signal EB "valid". When the read control signal _RD is not "0" and/or the address signal A15 is not "1", on the other hand, the enable circuit 121 determines that the current mode is a read mode, and makes the enable signal EB "invalid." The enable signal EB is a signal that permits writing of data into the register group 123. It can be said that the enable signal EB is in effect a write signal.

The decoder 122 receives the signals A8 to A14 (address bits) of 9th to 15th bits from the address bus 140. The decoder 122 then decodes the signals A8 to A14 to an address to specify a register in the register group 123.

The register group 123 contains, for example, 128's 8-bit registers (not shown). The register group 123 inputs signals A0 to A7 (data bits) of the 1st to 8th bits of the 16-bit information from the address bus 140. If the enable signal EB is valid, the register group 123 writes values of the signal A0 to A7 into the register specified by the decoder 122. If the enable signal EB is invalid, on the other hand, the register group 123 retrieves data from the register specified by the decoder 122 and outputs the data on the data bus 130. Each register is an 8-bit register because the data bus 130 is an 8-bit bus. When a 16-bit data bus is employed instead of the 8-bit data bus 130, either upper or lower eight bits may only be used and the remaining eight bits may be fixed to an arbitrary value (high impedance). Alternatively, the same 8-bit signal may be supplied to both the upper and lower 8 bits of the data bus.

The interface 124 is connected to the data bus 130, address bus 140 and read control signal line 150. The data bus 130 is coupled to the register group 123 via the interface 124. The bits A0 to A7 of the address bus 140 are connected to the register group 123, the bits A8 to A14 are connected to the decoder 122, and the bit A15 is connected to the enable circuit 121 via the interface 124. The read control signal line 150 is connected to the enable circuit 121 via the interface 124.

The data bus 130 and address bus 140 are conventional (or ordinary) buses. The data and address buses may also be connected to other circuits and equipment.

Figure 2:
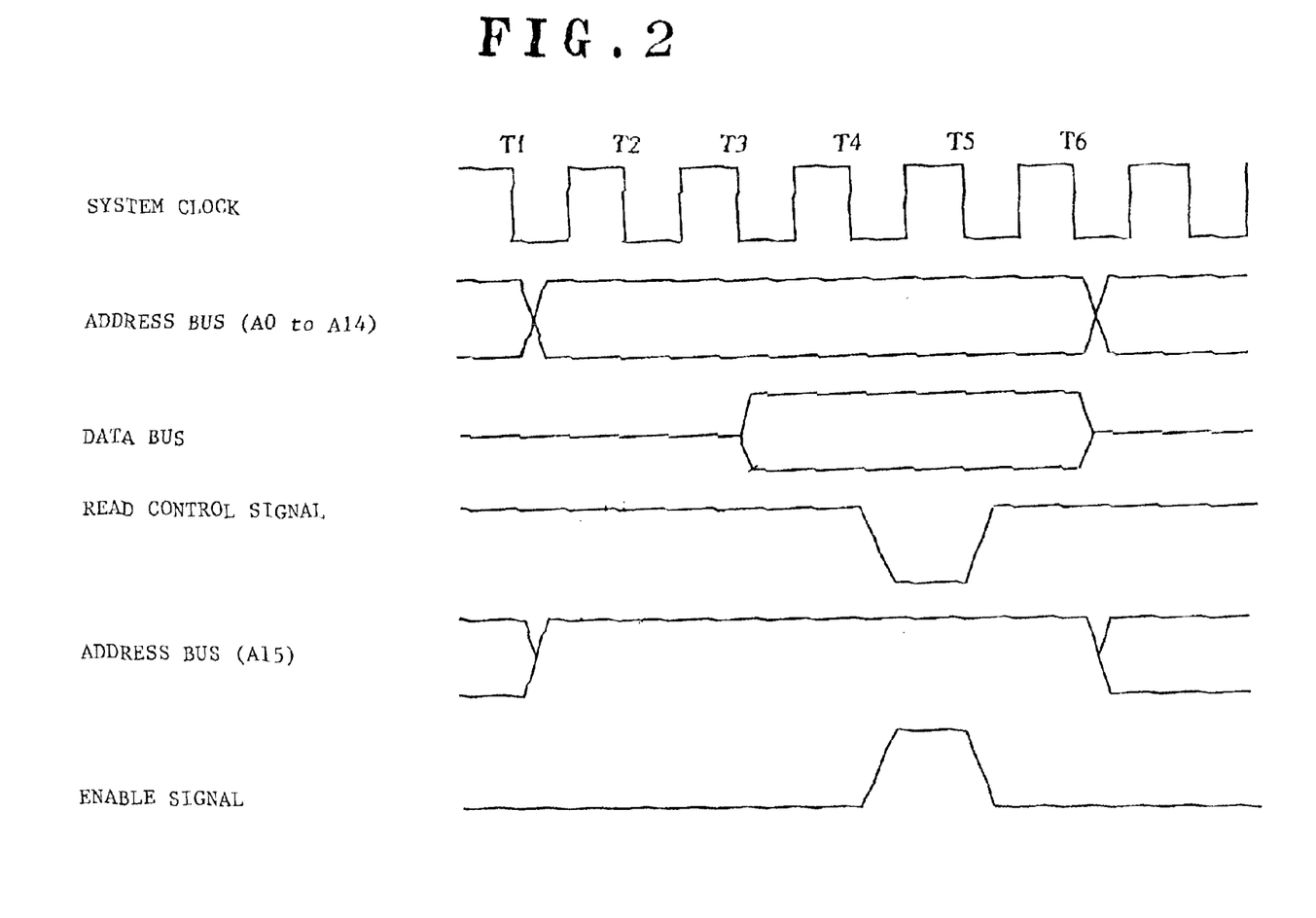
FIG. 2 illustrates a timing chart of operation performed by the data transmission system shown in FIG. 1.

Referring to FIG. 2, illustrated is a timing chart of operation performed by the data transmission system 100 shown in FIG. 1. It should be remembered that the sequence shown in FIG. 2 is basically a read sequence.

The data transmission system 100 writes data into the external circuit 120 in the following manner. As will be understood, an operation sequence for the data reading, executed by the micro-controller 110, is also utilized for the data writing.

First, the micro-controller 110 outputs a 16-bit information A0 to A15 on the address bus 140 at the time T1 of a system clock. In this embodiment, the most significant bit A15 on the address bus 140 is set to "1" when executing the write mode. An address to specify a particular register in the register group 123 is stored in the 9th to 15th bits A8 to A14 of the address bus 140. 8-bit data, which will be written into the specified register, is stored in the 1st to 8th bits A0 to A7 of the address bus 140.

The external circuit 120 reads the 16-bit information A0 to A15 from the address bus 140. As mentioned above, the most significant bit A15 of the 16-bit information is input to the enable circuit 121, the 9th to 15th bits A8 to A14 are decoded to address data, which is used to specify the register, by the decoder 122, and the 1st to 8th bits A0 to A7 are supplied to the register group 123.

Since the write mode is proceeding now, the external circuit 120 does not output data on the data bus 130 even if the 16-bit information A0 to A15 is supplied on the address bus 140. As mentioned above, however, the micro-controller 110 is executing the read mode sequence so that the micro-controller 110 determines that data is present on the data bus 130 a predetermined delay period after the provision of the 16-bit information on the address bus 140 (around the time T3 in FIG. 2). The micro-controller 110 reads the data from the data bus 130 between the times T4 and T5 of the system clock, and makes the read signal _RD active ("0").

The enable circuit 121 in the external circuit 120 makes the enable signal EB valid ("1") when the read signal _RD is active and the value of the bit A15 is one. Since the value of the bit A15 is "1" in the write mode, the enable signal EB is valid while the read signal _RD is being active (from T4 to T5).

The register specified by the decoder 122 stores the 1st to 8th bits A0 to A7 of the 16-bit information A0 to A15 when the enable signal EB rises in the timing chart (at the time T4 in FIG. 2).

After that, the micro-controller 110 outputs next 16-bit information A0 to A15 on the address bus 140 at the time T6 of the system clock. Subsequently, the same write operation as that between the times T1 and T5 is repeated.

As described above, the write sequence of the micro-controller 110 is the same as the read sequence in the system 100. The read sequence of the micro-controller 110 is the same as that of a conventional micro-controller. In other words, by simply employing the 16-bit information as information transmitted on the address bus 140, the data can be written into the external circuit 120 using the read sequence. Therefore, even if the micro-controller 110 does not possess a writing function for the external circuit (does not have a write control signal line), it is possible to write data into the external circuit 120.

Next, operation for reading data from the external circuit 120 will be described. As will be understood from the following description, the micro-controller 110 utilizes the same sequence as the sequence (read sequence) shown in FIG. 2. Thus, the single sequence is used in both the data reading and data writing.

At the time T1 of the system clock, the micro-controller 110 supplies the 16-bit information A0 to A15 on the address bus 140. The most significant bit A15 of the 16-bit information is set to "0" when executing the read mode in this embodiment. Like the writing operation, an address is stored in the 9th to 15th bits A8 to A14 to specify a particular register in the register group 123. In the reading operation, there is no need to store data in the 1st to 8th bits A0 to A7 of the 16-bit information.

The external circuit 120 reads the 16-bit information A0 to A15 from the address bus 140. The most significant bit A15 of the 16-bit information A0 to A15 is supplied to the enable circuit 121, and the 9th to 15th bits A8 to A14 are decoded to address data, which will be used to specify a register, by the decoder 122. Although the 1st to 8th bits A0 to A7 are input to the register group 123, these bits are not utilized in the reading operation. At this point, the read control signal _RD is not active ("1") so that the enable signal EB is invalid ("0"). When the enable signal EB is invalid, the register specified by the decoder 122 outputs data from its storage. This data is supplied to the data bus 130 via the interface 124.

The micro-controller 110 determines that data is present on the data bus 130 a predetermined delay period after the provision of the 16-bit information A0 to A15 on the address bus 140 (around the time T3 in FIG. 2). The micro-controller 110 then reads the data from the data bus 130 between the times T4 and T5 and makes the read signal _RD active ("0"). The read data is for example stored in RAM 113.

Since the most significant bit A15 of the 16-bit information is "0", the enable signal EB does not become valid even if the read signal _RD becomes active. Accordingly, the register specified by the decoder 122 does not store the 1st to 8th bits A0 to A7 of the 16-bit information.

At the time T6 of the system clock, the micro-controller 110 outputs next 16-bit information A0 to A15 on the address bus 140. The same reading operation as executed between the times T1 and T5 is then repeated.

Therefore, the sequence for the data reading of the micro-controller 110 in the system 100 is the same as the sequence for the data reading of the conventional micro-controller.

As described above, the writing and reading operations of the system 100 can be carried out with the same sequence as the sequence for the reading operation of a conventional system. Thus, it is possible to use a common micro-controller that does not have a writing function for the external circuit (does not have a write control signal line), in both writing and reading operations.

Since the data bus 130 is not utilized by the micro-controller 110 during the writing operation, it is feasible for the micro-controller 110 to write data into the external circuit 120 even if the data bus 130 is used for communication between other circuits (not shown), as long as the address bus 140 is available for the micro-controller 110. For example, the micro-controller 110 can write data into the external circuit 120 while DMA (Direct Memory Access) retransmission is being performed between other circuits.

Figure 3:
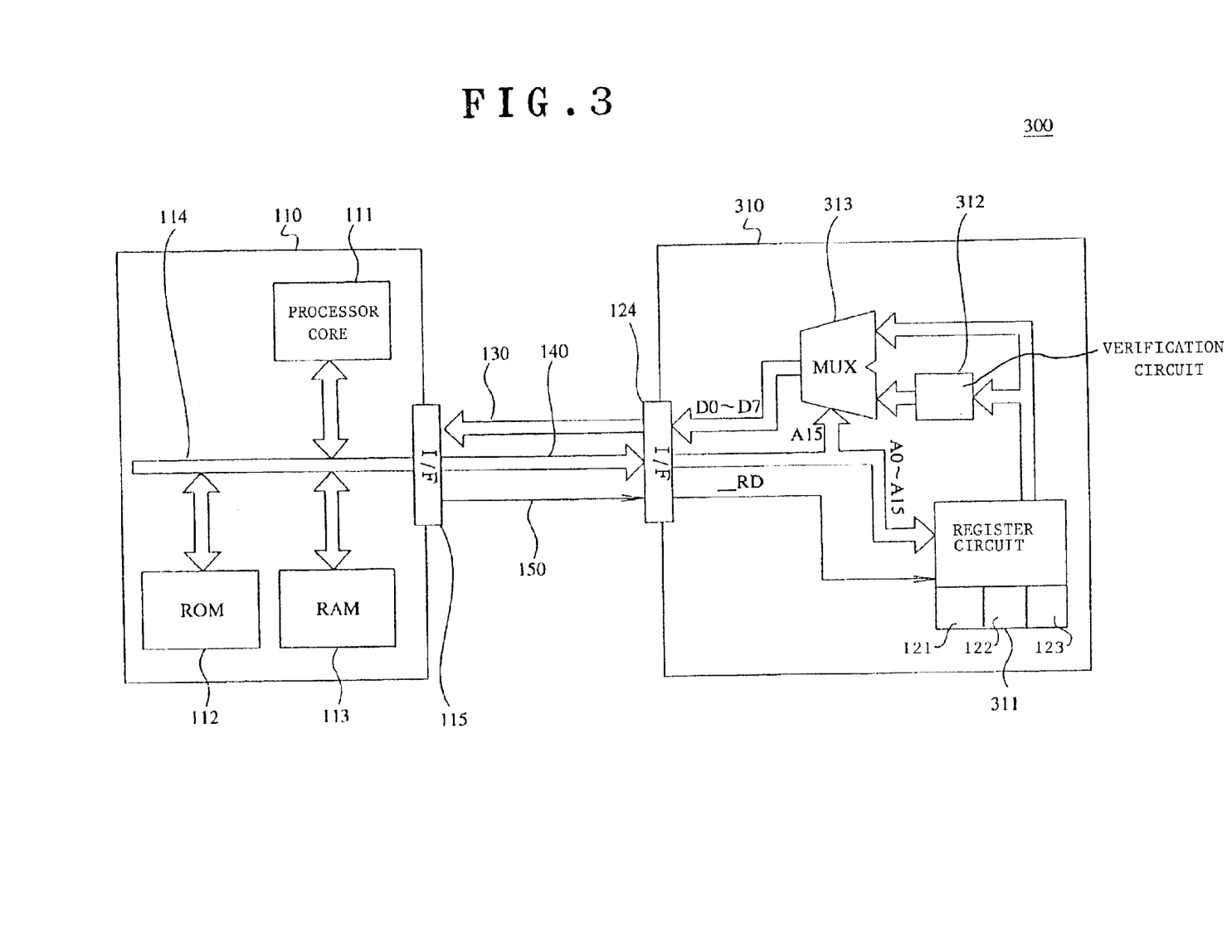
FIG. 3 illustrates a block diagram of a data transmission system according to a second embodiment of the present invention.

Second Embodiment:

A second embodiment will be described in reference to FIGS. 2 and 3. FIG. 3 illustrates a block diagram of a data transmission system 300 according to the second embodiment. Similar elements are assigned similar reference numerals in FIGS. 1 and 3, and detailed description of these elements is omitted.

As illustrated in FIG. 3, an external circuit 310 includes an interface 124, a register circuit 311, a verification circuit 312 and a multiplexer 313. The register circuit 311 includes an enable circuit 121, a decoder 122 and a register group 123, which are substantially the same as the enable circuit, decoder and register group in the external circuit 120 of the first embodiment.

The verification circuit 312 receives data from one register in the register group 123 specified by the decoder 122. The verification circuit 312 then generates verification data from the received data. The verification data is data used, for example, in a process for checking a checksum or parity.

The multiplexer 313 admits the data from the register specified by the decoder 122 at one input port of the multiplexer 313 and the verification data from the verification circuit 312 at the other input port. The multiplexer 313 also accepts the most significant bit A15 of the 16-bit information as a selection signal. When a signal value of the most significant bit A15 is "1", the multiplexer 313 outputs the verification data. When the signal value of the most significant bit A15 is "0", on the other hand, the multiplexer 313 outputs the data supplied from the register.

Now, operation of the data transmission system 300 will be described. The operational sequence of the micro-controller 110 for both the reading and writing operations in this embodiment is the same as that shown in FIG. 2. In other words, the first and second embodiments operate with the same sequence.

The operation for writing data into the external circuit 310 will first be described.

At the time T1 (FIG. 2), the micro-controller 110 outputs the 16-bit information A0 to A15 on the address bus 140. Like the write operation in the first embodiment, the most significant bit A15 of the 16-bit information is set to "1", an address to specify a particular register in the register group 123 is carried by the 9th to 15th bits A8 to A14, and 8-bit data to be written into the register specified by the 9th to 15th bits is carried by the 1st to 8th bits A0 to A7.

The external circuit 310 reads the 16-bit information A0 to A15 from the address bus 140. The most significant bit A15 of the 16-bit information is input to the enable circuit 121 and multiplexer 313, the 9th to 15th bits A8 to A14 are input to the decoder 122, and the 1st to 8th bits A0 to A7 are input to the register group 123.

Like the first embodiment, the micro-controller 110 makes the read signal _RD active ("0") between the times T4 and T5 of the system clock. The enable circuit 121 maintains the enable signal EB to be valid while the read signal _RD is being active (i.e., between the times T4 and T5).

The register specified by the decoder 122 stores the 1st to 8th bits A0 to A7 of the 16-bit information A0 to A15 when the enable signal EB rises in the timing chart. The stored data is then output to the verification circuit 312. Subsequently the verification circuit 312 prepares the verification data.

Since the signal value of the most significant bit A15 is "1", the multiplexer 313 selects and outputs the verification data. The verification data is supplied to the data bus 130 via the interface 124.

As described above, the micro-controller 110 executes the read sequence even if the write operation is actually proceeding. Thus, the verification data on the data bus 130 is taken into the micro-controller 110.

The system 300 can therefore output to the data bus 130 the result of verification regarding the data writing (or the written data) when the data is written in the external circuit 310.

Next, operation for reading data from the external circuit 310 will be described. The micro-controller 110 utilizes the same sequence as the conventional read sequence shown in FIG. 2.

At the time T1 of the system clock, the micro-controller 110 supplies the 16-bit information A0 to A15 on the address bus 140. The most significant bit A15 of the 16-bit information is set to "0". Like the first embodiment, an address is stored in the 9th to 15th bits A8 to A14 of the 16-bit information to specify a particular register in the register group 123, and no data is stored in the 1st to 8th bits A0 to A7 of the 16-bit information.

The external circuit 310 reads the 16-bit information A0 to A15 from the address bus 140. The most significant bit A15 of the 16-bit information A0 to A15 is supplied to the enable circuit 121 and multiplexer 313, and the 9th to 15th bits A8 to A14 are decoded to address data, which will be used to specify a register, by the decoder 122. The specified register then supplies data to the multiplexer 313.

Since the most significant bit A15 is "0", the multiplexer 313 selects the data supplied from the specified register.

In this manner, the data extracted from the register specified by the decoder 122 is supplied to the data bus 130 via the multiplexer 313 and interface 124. The data is then read into the micro-controller 110 from the data bus 130.

Figure 4:
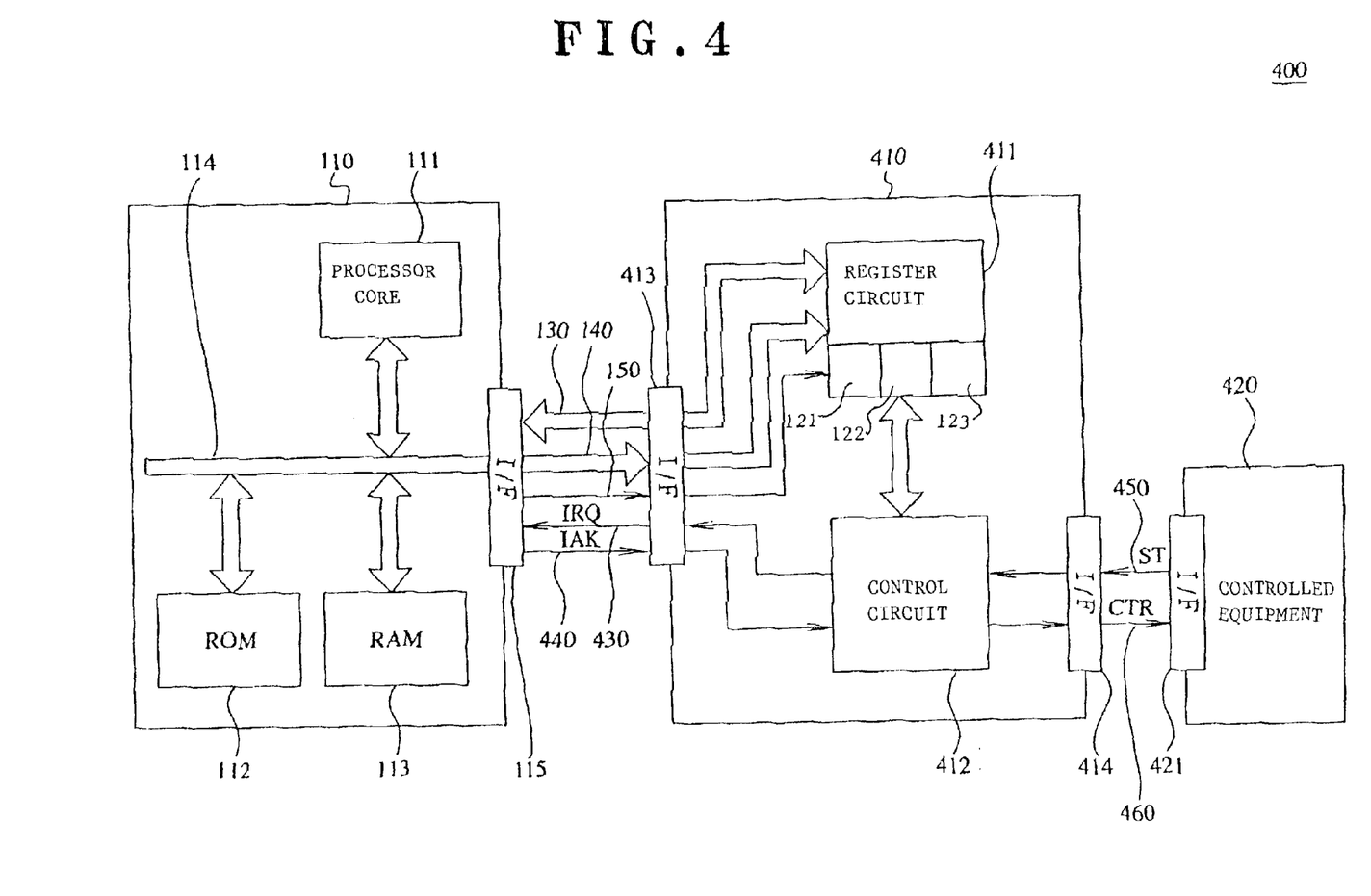
FIG. 4 illustrates a block diagram of a data transmission system according to a third embodiment of the present invention.

Third Embodiment:

A third embodiment will be described in reference to FIG. 4. FIG. 4 illustrates a block diagram of a data transmission system 400 according to the third embodiment. Similar elements are assigned similar reference numerals in FIGS. 1 and 4, and detailed description of these elements is omitted.

As illustrated in FIG. 4, the data transmission system 400 includes a micro-controller 110, an external exclusive-use controller 410 and equipment 420 to be controlled.

The external controller 410 includes a register circuit 411, a control circuit 412 and two interfaces 413 and 414.

The register circuit 411 includes an enable circuit 121, a decoder 122 and a register group 123, which are substantially the same as the enable circuit, decoder and register group in the external circuit 120 of the first embodiment. A plurality of registers are contained in the register group 123, and store a command supplied from the micro-controller 110 or status information to be sent to the micro-controller 110. The command is 8-bit data and the status information is also 8-bit data in this embodiment.

The control circuit 412 executes a command extracted from the register circuit 411. Upon execution of the command, the control circuit 412 supplies a control signal CTR to the equipment 420 and receives a status signal ST from the equipment 420. The control circuit 412 writes the received status signal ST, as the status information, into a register of the register group 123. The control circuit 412 also sends an interrupt request signal IRQ to the micro-controller 110 and receives an interrupt acknowledge signal IAK from the micro-controller 110.

The interface 413 is connected to the data bus 130, address bus 140 and read control signal line 150. The interface 413 is also connected to a control signal line 430 for the interrupt request signal IRQ and another control signal line 440 for the interrupt acknowledge signal IAK. Signals are transmitted between the interfaces 115 and 413 via the signal lines 130, 140, 150, 430 and 440.

The interface 414 is connected to the equipment 420 by the control signal lines 450 and 460. The control signal line 450 is used to receive the status signal ST and the control signal line 460 is used to send the control signal CTR.

The equipment 420 has an interface 421 to send the status signal ST and receive the control signal CTR via the control signal lines 450 and 460. The equipment 420 is controlled by the external controller 410 with the signals CTR and ST when the equipment 420 receives and sends the signals CTR and ST.

The operation for the micro-controller 110 to write data into the register circuit 411 is fundamentally the same as that in the first embodiment. It should be noted, however, that the command is carried by the 1st to 8th bits A0 to A7 of the 16-bit information when writing the data into the register circuit 411 in this embodiment. The command is therefore written into the register circuit 411 during the write operation in this embodiment. The command is read and executed by the control circuit 412. As a result, the control signal CTR is supplied to the equipment 420 from the control circuit 412. The control signal CTR controls the equipment 420.

The equipment 420 produces the status signal ST in accordance with the control performed based on the control signal CTR and transmits the status signal ST to the control circuit 412. The control circuit 412 writes the status signal ST into a prescribed register in the register circuit 411. The status signal ST is read from the register and supplied to the micro-controller 110 in accordance with the same reading operation as the system 100 of the first embodiment.

The control circuit 412 sends the interrupt request signal IRQ to the micro-controller 110 when the status signal ST has a certain value. Recognizing the reception of the interrupt request signal IRQ, the micro-controller 110 sends the interrupt acknowledge signal IAK to the control circuit 412, and writes the interrupt control command into the register circuit 411. The command writing operation is similar to the writing operation in the first embodiment. The command is read and executed by the control circuit 412. In this manner, the control circuit 412 can perform the interrupt control.

The data transmission system 400 can write the command into the external controller 410 using only the address bus 140. It is therefore possible to control the equipment 420 with a micro-controller that does not have a write function to an external circuit (have a connection to a write control signal line). The micro-controller possesses the interrupt function in this embodiment since the interrupt operation is expected.

Since the data bus 130 is not utilized by the micro-controller 110 during the writing operation, it is feasible for the micro-controller 110 to control the equipment 420 even if the data bus 130 is used for communication between other circuits (not shown), as long as the address bus 140 is available for the micro-controller 110. For example, the micro-controller 110 can write a command into the register circuit 411 while DMA data retransmission is being performed between other circuits. In this instance, however, the status information cannot be sent to the micro-controller 110 from the register circuit 411 since the data bus 130 is occupied by the DMA retransmission.

In this embodiment, the equipment 420 can be promptly controlled since the interrupt request signal IRQ and interrupt acknowledge signal IAK are used.

Fourth Embodiment:

A fourth embodiment will be described in reference to FIG. 5.

In this embodiment, a processing device of the invention is a program development board, and a data storage device of the invention is a ROM emulator.

Figure 5:
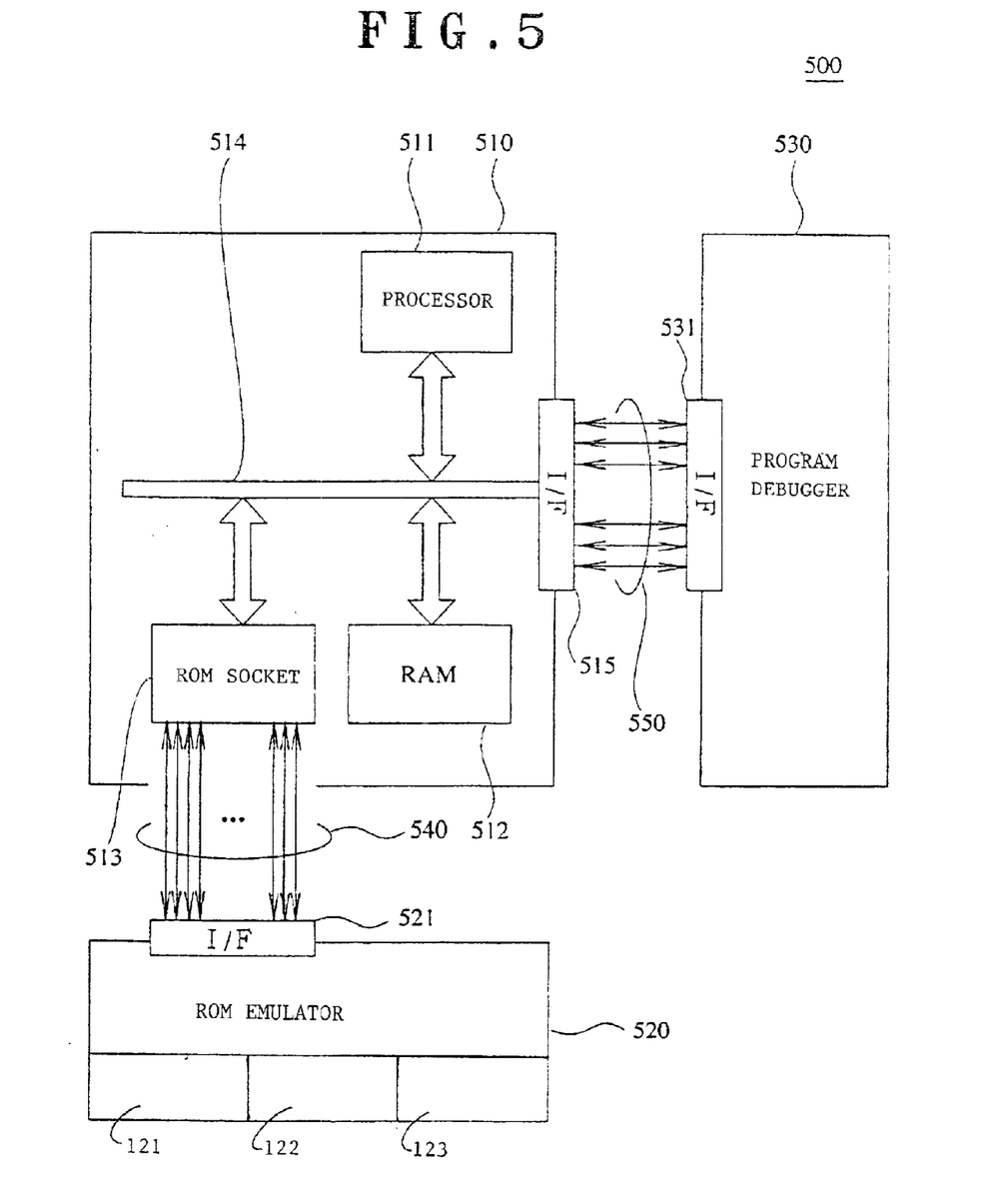
FIG. 5 illustrates a block diagram of a data transmission system according to a fourth embodiment of the present invention.

Referring to FIG. 5, illustrated is a block diagram of a system 500 of the fourth embodiment.

The system 500 includes a program development board 510, a ROM emulator 520, a program debugger 530 and connection cables 540 and 550.

The program development board 510 includes a processor 511, a RAM 512, a ROM socket 513 and an internal bus 514.

The processor 511 writes and reads data into and from the program debugger 530.

RAM 512 temporarily stores data to be written into the program debugger 530 and data read from the program debugger 530.

The ROM socket 513 connects the connection cable 540 to the internal bus 514.

The internal bus 514 transmits programs and data between the processor 511, RAM 512, ROM socket 513 and interface 515.

The interface 515 is an input/output circuit that couples the internal bus 514 with the connection cable 550.

The ROM emulator 520 stores a program to be executed by the processor 511. The ROM emulator 520 sends the program to the processor 511 and other elements via the interface 521, connection cable 540, ROM socket 513 and internal bus 514. The ROM emulator 520 receives data and information regarding the debugging from the processor 511 and other elements via the internal bus 514, ROM socket 513, connection cable 540 and interface 521. In this embodiment, the present invention is applied to data transmission between the ROM emulator 520 and processor 511. To this end, the ROM emulator 520 has an enable circuit 121, a decoder 122 and a register group 123, which are similar to the enable circuit, decoder and register group of the external circuit 120 in the first embodiment.

The program debugger 530 is a development tool. Specifically, the program debugger 530 debugs a program such as an application program. The program debugger 530 is, for example, a personal computer. It should be noted that the system of the fourth embodiment can be still employed if the program debugger 530 is replaced with another development tool. The program debugger 530 is coupled with the cable 550 at the interface 531.

The cable 540 connects the ROM socket 513 to the ROM emulator 520. As described above, the present invention is applied to the data transmission between the ROM socket 513 and ROM emulator 520. Therefore, the cable 540 includes a data bus, an address bus and a read control signal line according to the present invention.

The cable 550 connects between the interface 515 of the program development board 510 and the interface 531 of the program debugger 530. In general, the program debugger 530 can write and read data. Consequently, it is not necessary to apply the present invention to the data transmission from and to the program debugger 530 via the cable 550. Of course, however, the present invention can be used for the data transmission between the processor 511 and program debugger 530.

Fundamental operations of data transmission between the program development board 510 and ROM emulator 520 in this embodiment are the same as those in the first embodiment. Thus, the description of the operations is omitted.

Conventionally when a program is developed by a program development board, a system employs an EEPROM (Electrically Erasable Programmable Read Only Memory) attached to a ROM socket. A program is written into EEPROM, and sent to a program debugger under the control of a processor. This program is then executed by the program debugger. EEPROM is detached from the ROM socket by a program developer (engineer) every time an inconvenience such a bug is found as a result of the debugging. The program developer then rewrites the program in EEPROM. The EEPROM rewriting is one of major reasons for delaying the program development.

In the system 500 of the fourth embodiment according to the present invention, on the other hand, the ROM emulator 520 is attached to the ROM socket 513. The ROM emulator 520 can alter or modify a program without a troublesome rewriting operation which EEPROM has to undergo. A common program development board is, however, not adapted to send a write control signal to the ROM emulator 520 via the ROM socket 513 from the processor 511. Thus, the common program development board cannot write data into the ROM emulator 520. In order to speed up the debugging, it is desired for the program development board to be able to write data pertinent to the debugging into the ROM emulator 520.

In the embodiment shown in FIG. 5, therefore, the present invention is applied to the data transmission between the ROM socket 513 and ROM emulator 520. Accordingly, the data can be sent and written into the ROM emulator 520, even if the common program development board 510 is used in the system 500. Consequently, it is possible to increase freedom in the debugging process and improve the debugging efficiency.

As understood from the above description, the present invention makes it possible to write data into an external memory or the like by utilizing a processing device that does not write data to an external circuit (does not have a connection to a write control signal line) without modifying the processing device.

What is claimed is:

1. A data storage device comprising:
   an interface for accepting n-bit information from an address bus and a read control signal from a control signal line, the n-bit information including simultaneously an operation mode bit, an address bit and a data bit;
   an enable circuit for creating an enable signal from the operation mode bit and read control signal;
   a decoder for creating an address from the address bit;
   a register for storing the data bit in accordance with the address when the enable signal is valid;
   a verification unit for verifying the data bit stored in the register to create verification data when the enable signal, is valid, and
   an output unit for outputting the verification data to a data bus when the enable signal is valid, and for outputting a pre-stored data bit to the data bus from a memory area specified by the address when the enable signal is invalid.

2. The data storage device according to claim 1, further including a control unit for reading data from the register to execute a command in accordance with the read data.

3. The data storage device according to claim 1, wherein the data bus is one of an 8-bit and a 16-bit bus, the n-bit information is 16-bit information, the operation mode bit is carried by a most significant bit of the 16-bit information, the address bit is carried by ninth to fifteenth bits of the 16-bit information, and the data bit is carried by first to eighth bits of the 16-bit information.

4. The data storage device according to claim 1, wherein the data storage device is not connected to a write control signal line.

5. The data storage device according to claim 1, wherein data is absent in the data bit when the enable signal is invalid.

6. The data storage device according to claim 1, wherein the pre-stored data bit is status data supplied from equipment controlled on the basis of the data bit carried by the n-bit information.

7. The data storage device according to claim 6, wherein the data bit carried by the n-bit information is command data to control the equipment.

8. A data transmission system comprising:
 a micro-controller for outputting n-bit information on an address bus and a read control signal on a control signal line, the n-bit information including simultaneously an operation mode bit, an address bit and a data bit; and
 a data storage unit including
  an interface for accepting the n-bit information from the address bus and the read control signal from the control signal line,
  an enable circuit for creating an enable signal from the operation mode bit and read control signal,
  a decoder for creating an address from the address bit, and
  a register for storing the data bit in accordance with the address when the enable signal is valid;
  a verification unit for verifying the data bit stored in the register to create verification data when the enable signal is valid, and
  an output unit for outputting the verification data to a data bus when the enable signal is valid, and for outputting a pre-stored data bit to the data bus from a memory area specified by the address when the enable signal is invalid.

9. The data transmission system according to claim 8 further including a control unit for reading data from the register to execute a command in accordance with the read data.

10. The data transmission system according to claim 8, wherein the micro-controller is a program development board, and the data storage unit is a ROM emulator.

11. The data transmission system according to claim 8, wherein the micro-controller is adapted to only operate with a read sequence.

12. The data transmission system according to claim 8, wherein the data bus is one of an 8-bit and a 16-bit bus, the n-bit information is 16-bit information, the operation mode bit is carried by a most significant bit of the 16-bit information, the address bit is carried by ninth to fifteenth bits of the 16-bit information, and the data bit is carried by first to eighth bits of the 16-bit information.

13. The data transmission system according to claim 8, wherein the micro-controller and data storage unit are not connected by a write control signal line.

14. The data transmission system according to claim 8, wherein data is absent in the data bit when the enable signal is invalid.

* * * * *